US011066577B2

(12) United States Patent
Mihara et al.

(10) Patent No.: US 11,066,577 B2
(45) Date of Patent: Jul. 20, 2021

(54) ELECTRICALLY CONDUCTIVE ADHESIVE FILM AND DICING-DIE BONDING FILM USING THE SAME

(71) Applicant: Furukawa Electric Co., Ltd., Tokyo (JP)

(72) Inventors: Naoaki Mihara, Tokyo (JP); Noriyuki Kirikae, Tokyo (JP); Jirou Sugiyama, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 217 days.

(21) Appl. No.: 16/056,844

(22) Filed: Aug. 7, 2018

(65) Prior Publication Data
US 2018/0346766 A1 Dec. 6, 2018

Related U.S. Application Data
(63) Continuation of application No. PCT/JP2016/087658, filed on Dec. 16, 2016.

(30) Foreign Application Priority Data
Feb. 10, 2016 (JP) .............................. JP2016-023610

(51) Int. Cl.
| | | |
|---|---|---|
| C09J 9/02 | (2006.01) | |
| H01B 1/22 | (2006.01) | |
| C09J 11/04 | (2006.01) | |
| C09J 201/00 | (2006.01) | |
| C09J 163/00 | (2006.01) | |
| C09J 7/10 | (2018.01) | |
| C09J 4/00 | (2006.01) | |
| H01B 1/00 | (2006.01) | |
| C09J 7/35 | (2018.01) | |

(Continued)

(52) U.S. Cl.
CPC ............... *C09J 9/02* (2013.01); *C09J 4/00* (2013.01); *C09J 7/10* (2018.01); *C09J 7/35* (2018.01); *C09J 11/04* (2013.01); *C09J 163/00* (2013.01); *C09J 201/00* (2013.01); *H01B 1/00* (2013.01); *H01B 1/22* (2013.01); *H01B 5/14* (2013.01); *H01L 21/6836* (2013.01); *H01L 24/29* (2013.01); *C08K 3/08* (2013.01); *C08K 7/18* (2013.01); *C08K 9/02* (2013.01); *C08K 2003/085* (2013.01); *C08K 2003/0806* (2013.01); *C08K 2201/001* (2013.01); *C08K 2201/005* (2013.01); *C09J 2203/326* (2013.01); *C09J 2301/304* (2020.08); *C09J 2301/314* (2020.08); *C09J 2301/408* (2020.08); *C09J 2400/16* (2013.01); *C09J 2461/00* (2013.01); *C09J 2463/00* (2013.01); *C09J 2479/08* (2013.01); *H01L 24/73* (2013.01); *H01L 24/83* (2013.01); *H01L 24/92* (2013.01); *H01L 2224/2929* (2013.01); *H01L 2224/29311* (2013.01); *H01L 2224/29324* (2013.01); *H01L 2224/29347* (2013.01); *H01L 2224/29355* (2013.01); *H01L 2224/48247* (2013.01); *H01L 2224/48465* (2013.01); *H01L 2224/73265* (2013.01); *H01L 2224/83191* (2013.01); *H01L 2224/92247* (2013.01); *H01L 2924/181* (2013.01)

(58) Field of Classification Search
CPC ... C09J 9/02; C09J 11/04; C09J 201/00; C09J 163/00; C09J 7/10; C09J 4/00; C09J 2203/326; C09J 2400/16; C09J 2463/00; C09J 2479/08; C09J 7/00; C09J 201/025; C09J 7/35; C09J 2301/304; C09J 2301/314; C09J 2301/408; C09J 2461/00; H01B 1/00; H01B 5/14; H01B 1/22; H01L 2224/48247; H01L 2224/48465; H01L 24/73; H01L 24/83; H01L 24/92; H01L 2224/2929; H01L 2224/29311; H01L 2224/29324; H01L 2224/29347; H01L 2224/29355; H01L 2924/181; H01L 2224/73265; H01L 2224/83191; H01L 2224/92247; H01L 21/6836; H01L 24/29; C08K 9/02; C08K 2003/085; C08K 2003/0806; C08K 2201/001; C08K 3/08; C08K 7/18; C08K 2201/005
See application file for complete search history.

(56) References Cited
U.S. PATENT DOCUMENTS 3,055,861 A 9/1962 Hersh et al.
3,152,104 A 10/1964 Robert et al.
(Continued)

FOREIGN PATENT DOCUMENTS

CN 101238188 A 8/2008
CN 101636463 A 1/2010
(Continued)

OTHER PUBLICATIONS

English translation of Office Action for CN Application No. 201680077028.2, dated Jan. 13, 2021 (Year: 2021).*
(Continued)

*Primary Examiner* — Nathan L Van Sell
(74) *Attorney, Agent, or Firm* — Dorsey & Whitney LLP

(57) ABSTRACT

The electrically conductive adhesive film comprises a metal particle (P) and a resin (M), the resin (M) comprises a thermosetting resin (M1), and the metal particle (P) has an average particle size (d50) of 20 μm or less and comprises 10% by mass or more of a first metal particle (P1) having a fractal dimension of 1.1 or more when viewed in a projection drawing in a primary particle state.

13 Claims, 3 Drawing Sheets

(51) Int. Cl.
*H01B 5/14* (2006.01)
*H01L 21/683* (2006.01)
*H01L 23/00* (2006.01)
*C08K 9/02* (2006.01)
*C08K 3/08* (2006.01)
*C08K 7/18* (2006.01)

(56) References Cited

U.S. PATENT DOCUMENTS

| | | | |
|---|---|---|---|
| 3,244,662 | A | 4/1966 | Bottomley et al. |
| 4,129,553 | A | 12/1978 | Haberlein et al. |
| 5,182,351 | A | 1/1993 | Shiobara et al. |
| 5,304,418 | A | 4/1994 | Akada et al. |
| 6,833,180 | B1 | 12/2004 | Kodemura |
| 7,006,344 | B2 | 2/2006 | Echigo et al. |
| 7,384,900 | B2 | 6/2008 | Jo et al. |
| 10,689,550 | B2 | 6/2020 | Mihara et al. |
| 2003/0024733 | A1 | 2/2003 | Aoyama et al. |
| 2003/0221748 | A1 | 12/2003 | Arzadon et al. |
| 2004/0169162 | A1 | 9/2004 | Xiao et al. |
| 2004/0225026 | A1 | 11/2004 | Mizori et al. |
| 2006/0147683 | A1 | 7/2006 | Ikeda et al. |
| 2007/0026572 | A1 | 2/2007 | Hatakeyama et al. |
| 2007/0045594 | A1 | 3/2007 | Taira |
| 2007/0125449 | A1 | 6/2007 | Kajkvara Ryoichi et al. |
| 2007/0196612 | A1 | 8/2007 | Igarashi |
| 2008/0113184 | A1 | 5/2008 | Yoshida et al. |
| 2008/0122050 | A1 | 5/2008 | Ikeda et al. |
| 2010/0167073 | A1 | 7/2010 | Kitakatsu |
| 2012/0156512 | A1 | 6/2012 | Nakano et al. |
| 2013/0189513 | A1 | 7/2013 | Dreezen et al. |
| 2013/0306916 | A1 | 11/2013 | Gao et al. |
| 2014/0120356 | A1* | 5/2014 | Shearer .............. H01L 24/83 428/457 |
| 2014/0131898 | A1* | 5/2014 | Shearer .............. H01L 24/27 257/783 |
| 2014/0217331 | A1 | 8/2014 | Hata et al. |
| 2015/0129812 | A1 | 5/2015 | Scherf et al. |
| 2017/0025374 | A1 | 1/2017 | Fujiwara et al. |
| 2017/0313914 | A1 | 11/2017 | Natori |
| 2017/0369746 | A1 | 12/2017 | Mihara et al. |
| 2018/0237668 | A1 | 8/2018 | Mizori |
| 2018/0346767 | A1 | 12/2018 | Mihara et al. |
| 2018/0346768 | A1 | 12/2018 | Sato et al. |
| 2019/0016928 | A1 | 1/2019 | Mihara et al. |
| 2019/0016929 | A1 | 1/2019 | Mihara et al. |

FOREIGN PATENT DOCUMENTS

| | | |
|---|---|---|
| CN | 103597551 A | 2/2014 |
| CN | 104284928 A | 1/2015 |
| CN | 104946150 A | 9/2015 |
| CN | 107710336 A | 2/2018 |
| EP | 3333856 A1 | 6/2018 |
| EP | 3415578 A1 | 12/2018 |
| EP | 3495089 A1 | 6/2019 |
| JP | S6015622 A | 6/1985 |
| JP | H4371391 A | 12/1992 |
| JP | H7088687 A | 4/1995 |
| JP | H10261319 A | 9/1998 |
| JP | 2002263880 A | 9/2002 |
| JP | 2003045229 A | 2/2003 |
| JP | 2003211289 A | 7/2003 |
| JP | 2004124160 A | 4/2004 |
| JP | 2004160508 A | 6/2004 |
| JP | 2005276925 A | 10/2005 |
| JP | 2006032888 A | 2/2006 |
| JP | 2007152385 A | 6/2007 |
| JP | 2008144141 A | 6/2008 |
| JP | 2009177119 A | 8/2009 |
| JP | 20100221260 A | 10/2010 |
| JP | 2011102004 A | 5/2011 |
| JP | 2013152867 A | 8/2013 |
| JP | 2014152198 A | 8/2014 |
| JP | 2015193725 A | 11/2015 |
| KR | 20080035610 A | 4/2008 |
| KR | 20150013703 A | 2/2015 |
| KR | 20150071144 A | 6/2015 |
| WO | 2012164925 A1 | 12/2012 |
| WO | 2013047796 A1 | 4/2013 |
| WO | 2013172993 A1 | 11/2013 |
| WO | 2016076356 A1 | 5/2016 |

OTHER PUBLICATIONS

English Translation of Decision to grant issued in the priority Japanese patent application No. 2016-023610 dated Aug. 15, 2016.
English Translation of International Preliminary Report on Patentability Chapter I dated Aug. 14, 2018 for PCT Application No. PCT/JP2016/087658.
English Translation of Notice of Reason for Rejection Issued in the priority Japanese patent application No. 2016-023610 dated Mar. 28, 2016.
English Translation of the International Search Report and Written Opinion of the International Search Authority dated Feb. 7, 2017 for PCT application No. PCT/JP2016/087658, 31 pages.
Extended European Search Report received in EP Application No. 16889953.2 dated Aug. 27, 2019.
English translation of Office Action for KR Application No. 10-2018-7022053, dated Feb. 26, 2020.
English translation of the First Office Action received in CN Application No. 201680077028.2 dated Apr. 13, 2020.
"Thioanisole", Sigma-Aldrich, https://www.sigmaaldrich.com/catalog/product/sial/t28002lang=en®ion=US&cm_sp=Insite-_-caContent_prodMerch_gruCrossEntropy-_-prodMerch 10-1, Accessed Nov. 19, 2020, (Year: 2020).
English translation of Office Action for CN Application No. 201680077028.2, dated Sep. 14, 2020.
English translation of Office Action for KR Application No. 10-2018-7022053, dated Oct. 28, 2020.

* cited by examiner

[Figure 1]
(A)
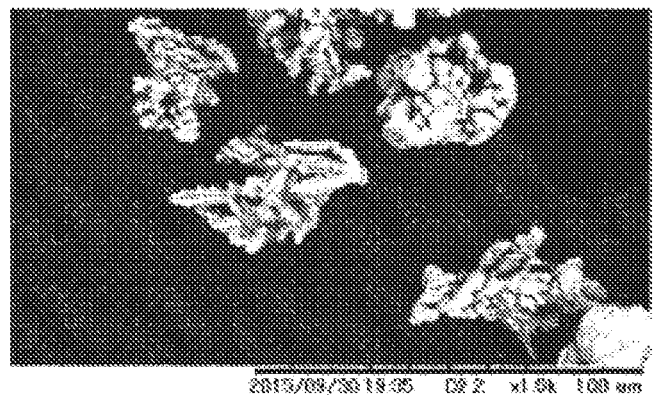
(B)
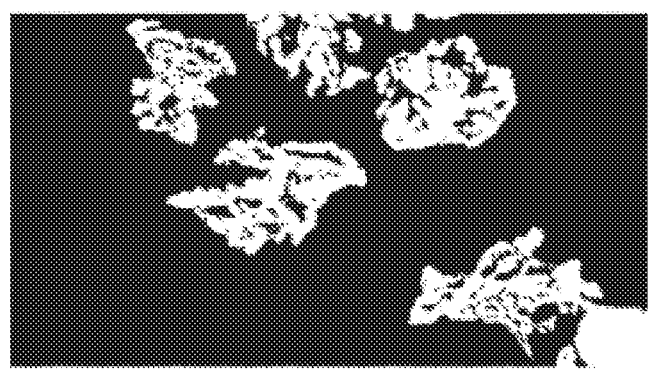
(C)
(D)
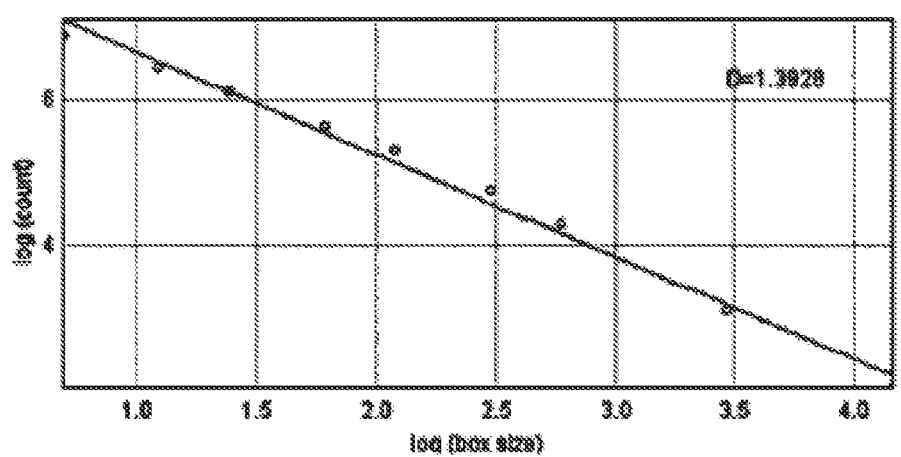

[Figure 2]
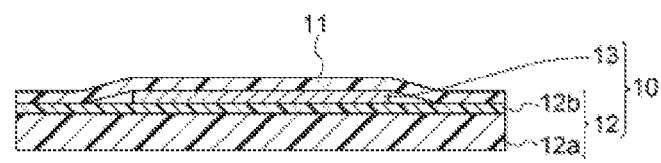
[Figure 3]
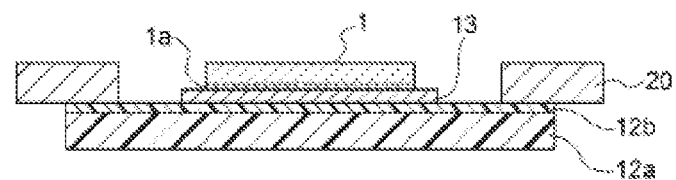
[Figure 4]
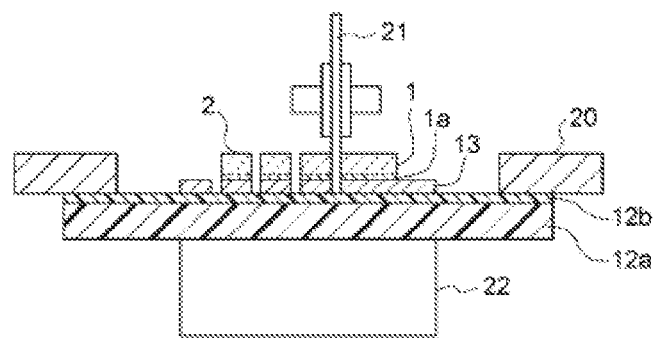

[Figure 5]
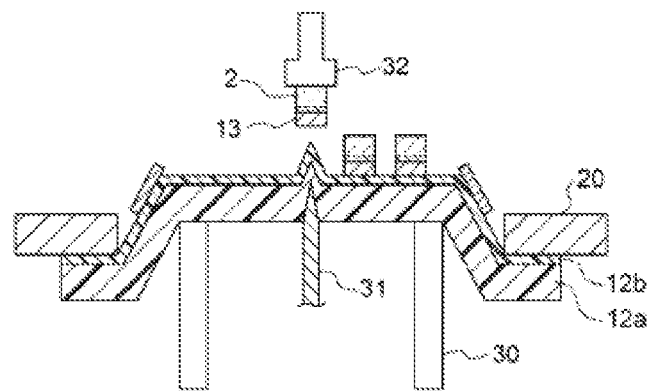
[Figure 6]
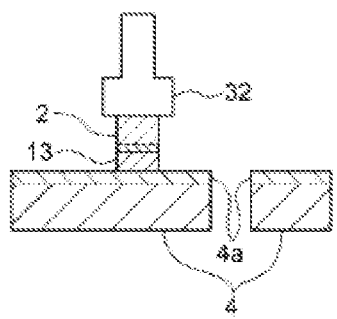
[Figure 7]
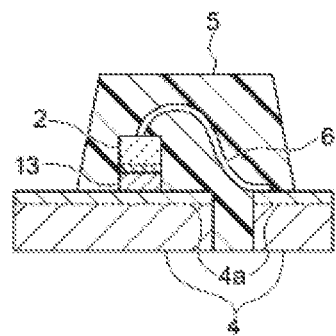

ELECTRICALLY CONDUCTIVE ADHESIVE FILM AND DICING-DIE BONDING FILM USING THE SAME

CROSS REFERENCE TO RELATED APPLICATIONS

The present application is a continuation application of International Patent Application No. PCT/JP2016/087658 filed on Dec. 16, 2016, which claims priority to Japanese Patent Application No. 2016-023610, filed on Feb. 10, 2016. The contents of these applications are incorporated herein by reference in their entirety.

BACKGROUND

Technical Field

The present disclosure relates to an electrically conductive adhesive film and a dicing-die bonding film using the same.

Background Art

In general, a semiconductor device is produced by a step of forming a die mounting material for bonding a semiconductor element (chip) onto an element-supporting part of a lead frame or onto a circuit electrode part of an insulating substrate, a step of mounting the semiconductor element onto the surface of the die mounting material on the lead frame or the circuit electrode to bond the semiconductor element to the element-supporting part of the lead frame or to the circuit electrode part of the insulating substrate, a wire-bonding step in which an electrode part of the semiconductor element is electrically bonded with a terminal part of the lead frame or with a terminal part of the insulating substrate, and a molding step in which the thus assembled semiconductor device is coated with a resin.

A bonding material is used for bonding a semiconductor element to an element-supporting part of a lead frame or to a circuit electrode part of an insulating substrate. For example, a lead solder comprising 85% by mass or more of lead having a high melting point and heat resistance has been widely used as a bonding material for power semiconductors such as IGBT and MOS-FET. However, hazardousness of lead has become a problem in recent years, and there is an increasing demand for lead-free bonding materials.

Also, SiC power semiconductors have features such that lower loss and operation at higher speed and higher temperatures compared with Si power semiconductors can be realized, and SiC power semiconductors are therefore considered to be a next-generation power semiconductor. Such SiC power semiconductors are theoretically capable of operations at 200° C. or higher, but improvement of the heat resistance of the surrounding materials including bonding materials is desired so as to actually realize high output and high density of systems such as inverters.

Under these circumstances, various lead-free, high-melting-point bonding materials have been valued in recent years. Au-based alloys such as Au—Sn-based alloys and Au—Ge-based alloys disclosed in Japanese Laid-Open Patent Publication No. 2006-032888, for example, can be mentioned as such high-melting-point lead-free bonding materials, and these alloy materials are noticed as having good electrical conductivity and thermal conductivity and being chemically stable. However, since such Au-based alloy materials which contain a noble metal are expensive, and since expensive high-temperature vacuum reflow machines are necessary for attaining higher mounting reliability, Au-based alloy materials are not yet in practical use.

Also, there is a problem such that many lead-free solders have poor wettability compared with lead solders. Due to this poor wettability, there is a higher risk that the solder will not wet over the die pad part and that bonding defects such as insufficient soldering will occur when using a lead-free solder as a bonding material. Since the problem of wettability particularly tends to become worse as the melting point of a lead-free solder increases, it was difficult to attain both heat resistance and mounting reliability at the same time.

In order to solve these problems, studies on diffusion sintering-type solders such as Cu-based and Sn-based solders have been pursued as described in Japanese Laid-Open Patent Publication Nos. 2007-152385 and 2002-263880. Since these diffusion sintering-type solders have a low melting point in a state before sintering and the mounting temperature can therefore be reduced, and since diffusion sintering-type solders will irreversibly have a high melting point in a state after the diffusion sintering reaction, diffusion sintering-type solders are expected to attain both heat resistance and mounting reliability at the same time, which was difficult with conventional lead-free solders. However, since diffusion sintering-type solders also have the problems of wettability as with conventional lead-free solders, the risk of insufficient soldering cannot be avoided when bonding a large surface area. Also, since diffusion sintering-type solders in a state of a sintered body are hard and brittle, there are problems of poor stress relaxation properties and low thermal fatigue resistance. Sufficient bonding reliability therefore has not yet been attained.

A flux such as a carboxylic acid or an alcohol is generally added to many lead solders and lead-free solders so as to remove the oxide film formed on a metal. However, these flux components easily absorb moisture and easily bleed out, and the absorbed moisture and the bleed-out are known to adversely affect the reflow resistance reliability (MSL) after moisture absorption in a sealed semiconductor element package. Flux is therefore generally washed off after the solder reflow mounting, but said treatment has problems of consuming time and the treatment of the washing wastewater. On the other hand, reduction of the added amount of the flux component, such as a carboxylic acid or an alcohol, that causes moisture absorption and bleed-out so as to avoid the aforementioned problems will cause another problem such that removing capability of the oxide film becomes poor and that sufficient electrical conductivity and other properties cannot be exerted. The problems therefore have not yet been fully solved.

SUMMARY

It is therefore an object of the present disclosure to provide an electrically conductive adhesive film which is suitable for use as an electrically conductive bonding material for bonding a semiconductor chip (particularly a power device) onto an element-supporting part of a lead frame or onto a circuit electrode part of an insulating substrate, for example, and which is capable of forming, between a semiconductor chip and an element-supporting part of a lead frame or a circuit electrode part of an insulating substrate, a bonding layer that has particularly excellent electrical conductivity and excels both in heat resistance after bonding and sintering and in mounting reliability while being lead-free. It is also an object of the present disclosure to provide a dicing-die bonding film using said electrically conductive adhesive film.

Solution to Problem

As a result of intensive study, the inventors of the present disclosure found that an electrically conductive adhesive film suitable for use as an electrically conductive bonding material capable of forming, between a semiconductor chip (particularly a power device) and an element-supporting part of a lead frame or a circuit electrode part of an insulating substrate, for example, a bonding layer that is lead-free, has particularly excellent electrical conductivity, and excels both in heat resistance after bonding and sintering and in mounting reliability can be obtained particularly by combining prescribed a metal particle (P) with a prescribed resin (M). The present disclosure was completed based on said finding.

The embodiments of the present disclosure are as follows.

[1] An electrically conductive adhesive film comprising:
  a metal particle (P); and
  a resin (M),
  wherein the resin (M) comprises a thermosetting resin (M1), the metal particle (P) has an average particle size (d50) of 20 μm or less, and
  the metal particle (P) comprises 10% by mass or more of a first metal particle (P1) having a fractal dimension of 1.1 or more when viewed in a projection drawing in a primary particle state.

[2] The electrically conductive adhesive film as described in the above [1], wherein the first metal particle (P1) is a dendritic metal powder.

[3] The electrically conductive adhesive film as described in the above [2], wherein the first metal particle (P1) has a surface coated with a noble metal.

[4] The electrically conductive adhesive film as described in the above [1], wherein the metal particle (P) further comprises a second metal particle (P2) made of a spherical metal powder.

[5] The electrically conductive adhesive film as described in the above [4], wherein the second metal particle (P2) has an average particle size (d50) of less than 7 μm.

[6] The electrically conductive adhesive film as described in the above [4], wherein the second metal particle (P2) comprises a metal particle made of tin or a tin-containing alloy.

[7] The electrically conductive adhesive film as described in the above ill, wherein a loss tangent (tan δ) defined by a ratio of a loss elastic modulus to a storage elastic modulus at 60° C. and 1 Hz in a B-stage state is 1.4 or higher.

[8] The electrically conductive adhesive film as described in the above [1], wherein the thermosetting resin (M1) comprises a maleic acid imide compound including two or more units of an imide group in a single molecule.

[9] The electrically conductive adhesive film as described in the above [8], wherein the maleic acid imide compound comprises a backbone derived from an aliphatic amine having a carbon atom number of 10 or more.

[10] The electrically conductive adhesive film as described in the above [1], wherein the thermosetting resin (M1) comprises an epoxy resin.

[11] The electrically conductive adhesive film as described in the above [10], wherein the epoxy resin comprises a molecular backbone derived from a glycidyl ether of an aliphatic diol.

[12] The electrically conductive adhesive film as described in the above [8], wherein the thermosetting resin (M1) further comprises a phenol novolac resin.

[13] The electrically conductive adhesive film as described in the above 1101, wherein the thermosetting resin (M1) further comprises an imidazole-based compound.

[14] A dicing-die bonding film, comprising:
  a dicing tape; and
  the electrically conductive adhesive film as described in the above [1] adhered to the dicing tape.

According to the present disclosure, the electrically conductive adhesive film comprises a metal particle (P) and a resin (M), the resin (M) comprises a thermosetting resin (M1), and the metal particle (P) has an average particle size (d50) of 20 μm or less and comprises 10% by mass or more of a first metal particle (P1) having a fractal dimension of 1.1 or more when viewed in a projection drawing in a primary particle state. Thus, an electrically conductive adhesive film suitable for use as an electrically conductive bonding material capable of forming, between a semiconductor chip (particularly a power device) and an element-supporting part of a lead frame or a circuit electrode part of an insulating substrate, for example, a bonding layer that is lead-free, has particularly excellent electrical conductivity, and excels both in heat resistance after bonding and sintering and in mounting reliability, and a dicing-die bonding film using the electrically conductive adhesive film can be provided thereby.

BRIEF DESCRIPTION OF DRAWINGS

FIG. 1(A) is an SEM image of an example of metal particle having a fractal dimension of 1.1 or more when viewed in a projection drawing in a primary particle state; FIG. 1(B) is a binarized image of the SEM image; FIG. 1(C) is an image obtained by extracting the profile line of the particle in the center of the binarized image; and FIG. 1(D) is a graph in which the box count (N(d)) is plotted against the box pixel size (d) on a common logarithmic scale based on the profile line.

FIG. 2 is a cross-sectional diagram showing the layer structure of a dicing-die bonding film of an embodiment of the present disclosure.

FIG. 3 is a diagram showing a state in which a dicing-die bonding film of the present disclosure is adhered to a semiconductor.

FIG. 4 is a diagram for explaining the dicing step.

FIG. 5 is a diagram for explaining the pick-up step.

FIG. 6 is a diagram for explaining the die-bonding step.

FIG. 7 is a diagram showing a cross-section of a resin-molded semiconductor element (device).

DESCRIPTION OF EMBODIMENTS

Hereinafter, embodiments of the electrically conductive adhesive film and the dicing-die bonding film using the same according to the present disclosure will be described in detail.

<Electrically Conductive Adhesive Film>

The electrically conductive adhesive film of the present embodiments comprises a prescribed metal particle (P) and a prescribed resin (M). Also, the electrically conductive adhesive film may further comprise various additives as necessary.

Unless otherwise mentioned, "metal particle" here mean not only a metal particle made of a single metal component, but also alloy particle made of two or more metal components.

[1] Metal Particle (P)

In the electrically conductive adhesive film of the present embodiments, the metal particle (P) has an average particle size (d50) of 20 μm or less. By limiting the average particle size to said range, a relatively thin (e.g., m or less) adhesive layer can be formed when using the electrically conductive adhesive film as an electrically conductive bonding material for bonding a semiconductor chip (particularly a power device) onto an element-supporting part of a lead frame or onto a circuit electrode part of an insulating substrate, for example. An average particle size (d50) in the present disclosure is a value calculated based on a measurement by the laser diffraction scattering particle size distribution measurement method. Conditions for measuring the average particle size (d50) will be explained later in the section concerning the examples.

The metal particle (P) comprises 10% by mass or more of a first metal particle (P1) having a fractal dimension of 1.1 or more when viewed in a projection drawing in a primary particle state. By including such first metal particle (P1) contained in an amount of 10% by mass or more, an electrically conductive adhesive film which particularly excels in electrical conductivity can be obtained. The metal particle (P) is merely required to comprise 10% by mass or more of the first metal particle (P1), and the metal particle (P) may consist of the first metal particle (P1) alone, or may be a mixture comprising, in addition to the first metal particle (P1), one or more types of metal particle having a different particle shape.

A fractal dimension of 1.1 or more means when viewed in a projection drawing in a primary particle state that the metal particle (particularly the surface profile shape of the particle) has a complex shape. A fractal dimension indicates geometric complexity, and a fractal dimension of a particle when viewed in a projection drawing in a primary particle state, i.e., a two-dimensional fractal dimension, is specified in the present embodiments. Simple shapes with a surface profile shape of an exact circle, a square, a rectangle, or the like, for example, have a two-dimensional fractal dimension of approximately 1, and the fractal dimension increases and nears 2 as the shape becomes more complicated, as in a jagged shape.

Here, a primary particle means an independent particle that is not agglomerated with other particle.

Also, in the present embodiments, a projection drawing in a primary particle state is obtained by extracting a profile line of a primary particle by processing an image of a primary particle obtained by using an SEM (scanning electron microscope), a TEM (transmission electron microscope), or the like. FIG. 1 shows one example.

FIG. 1(A) is an SEM image of a gold-coated dendritic copper powder, and FIG. 1(C) is a projection drawing (profile line) in a primary particle state obtained by processing the image of a particle in FIG. 1(A).

In the present embodiments, an analyzing method of a fractal dimension is particularly not limited to any method, and the box-counting method and the pixel method can be mentioned, for example.

For example, analysis of a fractal dimension by the box counting method is performed as follows.

When a figure on a plane surface is divided into squares with a side length d, the figure is covered with N (d) squares, and N(d) and d have the following relationship:

$$N(d) = ad^{-D} \text{ (}a \text{ is a positive constant)} \quad \text{(I)},$$

D is defined as the fractal dimension of the figure.

The following equation can be obtained by taking the log of both sides of the equation (I):

$$\log_{10} N(d) = -D \log_{10} d + \log_{10} a \text{ (}a \text{ is a positive constant)} \quad \text{(II)},$$

and a fractal dimension D can be calculated from the slope of a straight line obtained by drawing a log-log plot of N(d) against d.

Specific steps will be explained below by reference to FIG. 1. The below-described steps are only an example and the method for determining the fractal dimension is not limited thereto.

First, by using any given imaging software ("Image-J" developed by Wayne Rasband of the U.S. National Institutes of Health (NIH) was used in the present disclosure), an image of a primary particle obtained by using an SEM, TEM, or the like (FIG. 1(A): SEM image) is changed to a projection drawing in the form of a binary image (FIG. 1(B)) through a binarization process or the like, and then a profile line is extracted from the projection drawing (FIG. 1(C)).

Next, square boxes with different pixel sizes having a side length d (here, d is an arbitrary pixel size of 2 pixels or more) are defined in the processed image, and the number N (d) of boxes necessary for covering the profile line of the primary particle is counted with respect to each box (side length: d).

Then, the obtained values N (d) are plotted on a common logarithmic scale against the side length d of the boxes (FIG. 1 (D)), the slope of the straight line is calculated in accordance with the above equation (II), and the fractal dimension D is calculated. The fractal dimension D of the projection drawing in a primary particle state shown in FIG. 1 calculated by the box counting method was 1.39.

Examples of the first metal particle (P1) having a fractal dimension of 1.1 or more when viewed in a projection drawing in a primary particle state include dendritic metal powders as shown in FIG. 1, and metal powders that have relatively complex profile shapes such as those having a starfish-shape, a spherical shape with a finely jagged surface, and the like. Among these examples, a metal powder with a dendritic shape is preferable. The contact ratio between metal particles increases by having a dendritic metal powder contained in the first metal particle (P1), and electrical conductivity is enhanced thereby in an electrically conductive adhesive film.

The metal particle (P) preferably further comprises a second metal particle (P2) made of a spherical metal powder in addition to the first metal particle (P1). The degree of viscosity increase caused by the interface friction between the surfaces of the metal particle and the resin component can be controlled by having the second metal particle (P2) contained in the metal particle (P), and the viscosity can be optimized according to purposes. Electrical conductivity can also be improved. Here, a spherical metal powder means a metal particle having a fractal dimension of 1.0 or more and less than 1.1 when viewed in a projection drawing in a primary particle. A metal powder produced by an atomization method, for example, can be mentioned as such a spherical metal powder.

More preferably, the second metal particle (P2) has an average particle size (d50) of less than 7 μm. By limiting the average particle size to this range, the second metal particle (P2) easily enters into the spaces in the first metal particles (P1). The packing density of the metal can be increased and the electrical conductivity can be enhanced thereby.

The first metal particle (P1) and the second metal particle (P2) are not particularly limited, but the particle made of a single type of metal selected from the group of copper (Cu), nickel (Ni), aluminum (Al), tin (Sn), zinc (Zn), titanium (Ti), silver (Ag), gold (Au), indium (In), bismuth (Bi), gallium (Ga) and palladium (Pd) or an alloy comprising two or more metals selected from said group, for example, is preferable. Among said examples, a particle made of a single metal selected from the group of copper (Cu), nickel (Ni), aluminum (Al) and tin (Sn) or an alloy comprising two or more metals selected from said group, which excel in electrical conductivity and thermal conductivity, which is relatively inexpensive, and which is unlikely to cause ion migration, are more preferable. Also, the melting point of the overall metal particle (P) can be further reduced when at least one of the first metal particle (P1) and the second metal particle (P2) is an alloy comprising at least two metals selected from copper (Cu), nickel (Ni), aluminum (Al), tin (Sn), zinc (Zn), titanium (Ti), silver (Ag), gold (Au), indium (In), bismuth (Bi), gallium (Ga) and palladium (Pd).

At least one of the first metal particle (P1) and the second metal particle (P2) preferably has a surface coated with a noble metal (e.g., silver or gold). By coating the surface of the metal particle with a noble metal (preferably silver or gold), an oxide film is less likely to be formed on the surface of the metal particle, and high electrical conductivity will be exerted in the electrically conductive adhesive film. Also, since an oxide film is less likely to be formed on the surfaces of these metal particles, there is no need to use a flux component for removing the oxide film. As a result, various problems derived from flux components can be solved, and the reflow resistance reliability after moisture absorption (MSL), in particular, can be greatly enhanced. Although the coating of a noble metal does not necessarily need to cover the entire surface, and the surface of the first metal particle (P1) and the surface of the second metal particle (P2) are merely required to be at least partially coated with a noble metal, a larger coated area is preferable. Silver-coated dendritic copper powder and silver-coated spherical copper powder and the like can be mentioned as the examples of such first metal particle (P1) and second metal particle (P2).

Each of the first metal particle (P1) and the second metal particle (P2) may be composed of a single type of metal powder (e.g., a powder having the same fractal dimension when viewed in a projection drawing in a primary particle state, average particle size, composition, presence and absence of a coating, etc.), or may be a mixture in which two or more different types of metal powders (e.g., powders that differ from one another in terms of at least one of the fractal dimension when viewed in a projection drawing in a primary particle state, average particle size, composition, presence and absence of a coating, etc.) are mixed. The second metal particle (P2), in particular, is preferably a mixture.

Also, the second metal particle (P2) preferably comprises a metal component capable of forming an intermetallic compound between the first metal particle (P1) and the second metal particle (P2), or between the second metal particle (P2) and the second metal particle (P2). By allowing an intermetallic compound between the first metal particle (P1) and the second metal particle (P2) or between the second metal particle (P2) and the second metal particle (P2) to form, a high-melting intermetallic compound can be formed in a state after sintering while the overall metal particle (P) is a metal or an alloy with a low melting point in a state before sintering. As a result, by having such the second metal particle contained, low mounting temperature can be realized while exerting excellent heat resistance after sintering whereby the properties do not deteriorate even at the mounting temperature or higher temperatures.

The combinations of metal components capable of forming such the intermetallic compound can be freely selected as necessary, and examples include combinations based on Cu—Sn, Ni—Sn, Ag—Sn, Cu—Zn, Ni—Zn, Ag—Zn, Ni—Ti, Sn—Ti, Al—Ti and Au—In. It is preferable that one metal component corresponding to these combinations capable of forming an intermetallic compound is contained in each of the first metal particle (P1) and the second metal particle (P2), or each of the two or more types of the second metal particle by one metal component per one combination. A combination comprising Sn having a low melting point is preferable when the mounting temperature needs to be reduced as much as possible. A combination based on Cu—Sn or Ni—Sn, in particular, is more preferable. A specific example includes a case in which the first metal particle is a dendritic copper powder and the second metal particle (P2) is a spherical tin powder, or a case in which the second metal particle (P2) is a mixture of two types of metal powders based on different metal components, where a spherical tin powder is used as one type of the second metal particle (P2) and a spherical copper powder is used as the other type of the second metal particle (P2).

Given the above, the first metal particle (P1) is preferably a dendritic copper powder, more preferably a dendritic copper powder coated with a noble metal (preferably silver or gold).

Also, the second metal particle (P2) is preferably a mixture comprising a metal particle made of spherical tin or a tin-containing alloy.

The content of the first metal particle (P1) relative to 100% by mass of the metal particle (P) is 10% by mass or more, preferably from 10 to 100% by mass, more preferably from 30 to 80% by mass. Sufficient electrical conductivity-improving effect cannot be exerted if the content of the first metal particle (P1) is less than 10% by mass.

In addition, the content of the second metal particle (P2) relative to 100% by mass of the metal particle (P) is preferably from 0 to 90% by mass, more preferably from 20 to 70% by mass. Also, the content of metal particle (P2-1) made of Sn or an Sn-containing alloy relative to 100% by mass of the second metal particle (P2) is preferably 30% by mass or more.

The metal particle (P) may further comprise one or more of the other metal particle (Pn) having different particle shapes or sizes as necessary in addition to the first metal particle (P1) and the second metal particle (P2). The content of the further metal particle is preferably 50% by mass or less relative to 100% by mass of the metal particle (P).

In terms of reducing environmental load, the metal particle (P) is preferably substantially free of Pb (lead), Hg (mercury), Sb (antimony) and As (arsenic). The total content of these components is preferably less than 0.1% by mass relative to 100% by mass of the metal particle (P).

The content of the metal particle (P) in the electrically conductive adhesive film of the present embodiments is preferably from 70 to 9%% by mass, more preferably from 80 to 94% by mass. By limiting the content of the metal particle (P) within this range, formability of the electrically conductive adhesive film can be enhanced when the electrically conductive adhesive film is formed, handleability as a film can be improved, and excellent electrical conductivity further can be exerted after adhesion and sintering.

[2] Resin (M)

The resin (M) used in the electrically conductive adhesive film of the present embodiments comprises a thermosetting resin (M1). The thermosetting resin (M1) contained in the electrically conductive adhesive film has functions of contributing to the film properties (formability, handleability, etc.) in a state before sintering, and relaxing the stress and the like between the semiconductor element and the substrate (lead frame, etc.) caused by thermal cycle in a state after sintering.

The thermosetting resin (M1) preferably comprises a maleic acid imide resin comprising a maleic acid imide compound containing two or more units of an imide group in a single molecule (this resin may hereinafter be called a "maleimide resin") or an epoxy resin, more preferably a maleic acid imide resin, particularly from the viewpoint of heat resistance, and the film properties when being mixed with the metal particle (P). In particular, since a thermosetting resin (M1) comprising one of the aforementioned resins excels in stress relaxation properties, thermal fatigue resistance of the electrically conductive adhesive film after sintering can be improved. As a result, an electrically conductive adhesive film comprising such a thermosetting resin (M1) is capable of overcoming the drawbacks in terms of thermal fatigue resistance, i.e., being hard and brittle, which were the problems of conventional all-metal lead-free solders.

A maleic acid imide resin can be obtained by condensing maleic acid or its anhydride with a diamine or a polyamine, for example. A maleic acid imide resin comprising a backbone derived from an aliphatic amine having a carbon atom number of 10 or more is preferable from the viewpoint of stress relaxation properties, and a maleic acid imide resin having a carbon atom number of 30 or more and a backbone represented by the structural formula (1) below, in particular, is more preferable. Also, a maleic acid imide compound preferably has a number average molecular weight of 3000 or more.

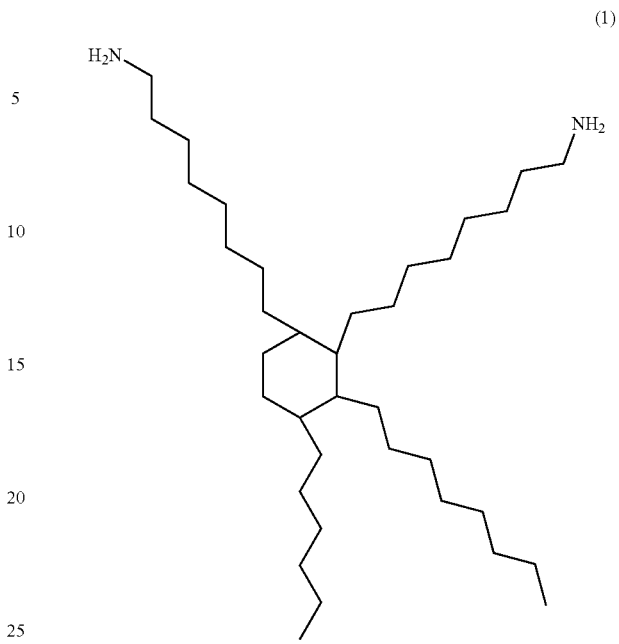

(1)

Molecular weight, glass transition temperature Tg, and the like of a maleic acid imide resin may be adjusted by comprising an acid component other than maleic acid such as a backbone derived from benzenetetracarboxylic acid or its anhydride, hydroxyphthalic acid bis(ether) or its anhydride, or the like. A phenol novolac resin, a radical generator, or the like is preferably used as a curing agent for the maleic acid imide resin.

Also, bismaleimide resins represented by the following structural formulas (2) to (4), for example, can be suitably used as such a maleic acid imide resin.

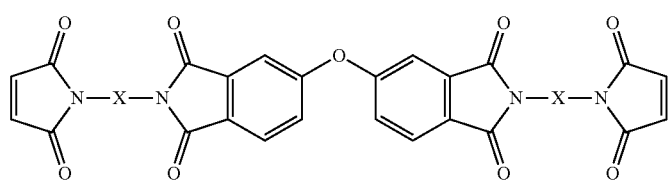

(2)

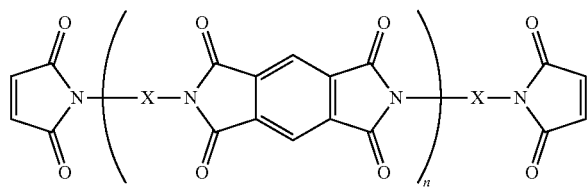

(3)

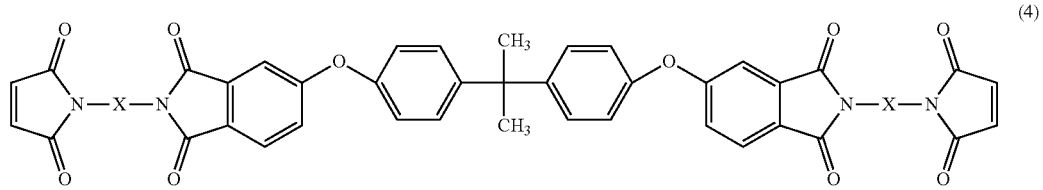

(4)

In the formula (3), n is an integer from 1 to 10. Also, in the formulas (2) to (4), the moiety represented by "X" is a backbone "$C_{36}H_{72}$" represented by the following structural formula (5). In the formula (5), "*" means the bonding position with N.

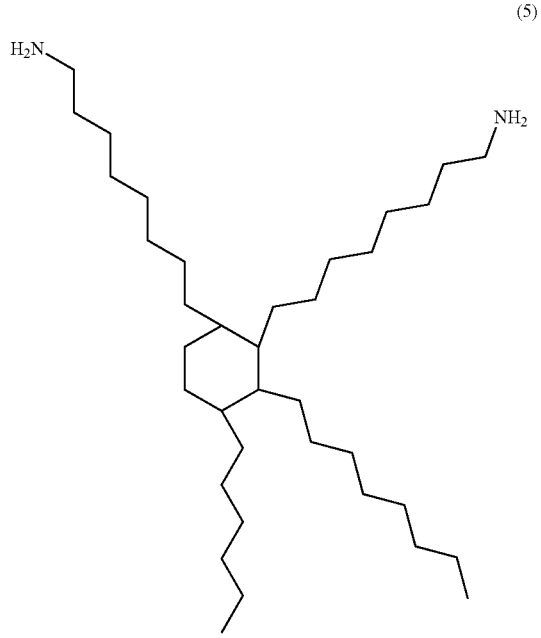 [SMILES: CCCCCCCCC1C(CCCCCC)CCC(CCCCCCCCN)C1CCCCCCCCN]

(5)

Bisphenol A-type epoxy resins, bisphenol F-type epoxy resins, phenoxy resins which are high-molecular-weight epoxy resins, and epoxy resins comprising a molecular backbone derived from a glycidyl ether of an aliphatic diol, for example, can be suitably used as the epoxy resin.

Among such epoxy resins, epoxy resins comprising a molecular backbone derived from a glycidyl ether of an aliphatic diol are preferably contained. Ethylene glycol-modified epoxy resins, propylene glycol-modified epoxy resins, butanediol-modified epoxy resins, and the like can be mentioned as the epoxy resins comprising a molecular backbone derived from a glycidyl ether of an aliphatic diol. Flexibility of the electrically conductive adhesive film can be furthermore improved by comprising such an epoxy resin.

Also, the epoxy resin is preferably a mixture of the aforementioned resins, and a mixture of a bisphenol A-type epoxy resin and a bisphenol F-type epoxy resin and a phenoxy resin is preferable from the viewpoint of balancing stress relaxation properties and film properties, for example. Also, a mixture of an epoxy resin comprising a molecular backbone derived from a glycidyl ether of an aliphatic diol, and the aforementioned bisphenol A-type epoxy resin, bisphenol F-type epoxy resin, phenoxy resin, and the like is preferable from the viewpoint of attaining both adhesive strength and flexibility.

Acid anhydrides, phenol novolac resins, amines, imidazole-based compounds, dicyandiamides, and the like can be selected as the curing agent for the epoxy resin. Among these examples, phenol novolac resins and imidazole-based compounds are preferable.

The thermosetting resin (M1) preferably further comprises a phenol novolac resin. By using the aforementioned maleic acid imide resin or epoxy resin in combination with a phenol novolac resin, for example, the phenol novolac resin functions as a curing agent, and adhesion of the electrically conductive adhesive film is furthermore improved.

The thermosetting resin (M1) preferably further comprises an imidazole-based compound particularly when it contains an epoxy resin. By using the aforementioned epoxy resin in combination with an imidazole-based compound, the imidazole-based compound functions as a curing agent, and adhesion of the electrically conductive adhesive film is furthermore improved.

The content of the resin (M) in the electrically conductive adhesive film of the present embodiments is preferably from 4 to 30% by mass, more preferably from 6 to 20% by mass. By limiting the content of the resin (M) within the aforementioned range, the electrically conductive adhesive film excels in film properties (formability, handleability, etc.) in a state before sintering, and excels in relaxing the stress and the like between the semiconductor element and the substrate (lead frame, etc.) caused by thermal cycle in a state after sintering. The resin (M) may consist of a single type of resin or two or more resins may be mixed. Also, resins other than the aforementioned resins may be further contained as necessary.

[3] Other components

The electrically conductive adhesive film of the present embodiments may comprise various additives in addition to the aforementioned components within a range that does not deviate from the object of the present disclosure. Such additives can be suitably selected as necessary, and examples include fluxes, dispersing agents, radical polymerization initiators, leveling agents and plasticizers.

Even when a metal oxide film is formed on the surface of the metal particle (P), particularly when the proportion of the particle coated with a noble metal in the metal particle (P) is less than 50% by mass, the metal oxide film can be removed and electrical conductivity can be further improved by the aforementioned flux contained in the electrically conductive adhesive film. There is no particular limitation to the fluxes as such fluxes, and known materials can be widely used. Hydroxylamine salts, tetraethylene glycol, abietic acid, organic phosphorus compounds, sulfide compounds, and the like can be mentioned as the examples of a flux.

When the electrically conductive adhesive film of the present embodiments comprises a flux, the content of the flux is preferably from 0.5 to 10.0% by mass, more preferably from 1.0 to 5.0% by mass. Sufficient metal oxide film-removing properties can be exerted by limiting the content of the flux to the aforementioned range.

In terms of the aforementioned MSL reliability, it is more preferable for the electrically conductive adhesive film to be substantially free of flux by adjusting the proportion of the particle coated with a noble metal in the metal particle (M) to 50% by mass or more when electrically bonding a semiconductor element to a lead frame by using the electrically conductive adhesive film of the present embodiments, and sealing the bonded element with an epoxy resin or the like.

Since the electrically conductive adhesive film of the present embodiments has form of a film, it can be more easily handled compared with conventional solders and electrically conductive pastes at the time of bonding a power semiconductor element to a substrate, for example. Specifically, the overall wafer can be divided when the electrically conductive adhesive film of the present embodiments is adhered to the back surface of a wafer on which a power semiconductor is formed and the wafer is divided into each element to produce chips (dicing step). Since just the right amount of an electrically conductive adhesive film can be formed onto the entire back surface of the elements (wafer), problems of conventional solders such as insufficient wetting and running off can be avoided and good mounting can be performed. Also, since an electrically conductive adhesive film is formed in advance with a prescribed thickness, the height of the element after die-bonding can be easily controlled with precision compared with conventional solders and electrically conductive pastes.

The method for producing the electrically conductive adhesive film of the present embodiments is not particularly limited, and the electrically conductive adhesive film can be produced by a known method. A method in which appropriate amounts of the aforementioned components are weighed and mixed by a known method, and the obtained mixture is formed into a film by a known method can be mentioned, for example. Examples of such the mixing method include mixing by agitation using rotating blades, and mixing with the use of a homogenizer, a planetary mixer or a kneader. Also, examples of the forming method include a method in which a varnish obtained by dissolving or dispersing the aforementioned mixture in a solvent is applied onto a substrate and then dried, a melt-application method in which the electrically conductive adhesive film is melted at high temperatures and then applied onto a substrate, a method in which the electrically conductive adhesive film is pressed at a high pressure together with the substrate, an extrusion method in which the electrically conductive adhesive film is melted, extruded with the use of an extruder and then drawn, and a printing method in which a screen mesh (screen printing) or a metal plate (gravure printing) is filled with the aforementioned varnish so as to transfer the same.

Thickness of the electrically conductive adhesive film is preferably from 5 to 100 μm, more preferably from 20 to 50 μm. Sufficient adhesive power can be obtained while suppressing electric resistance and heat resistance by limiting the thickness of the electrically conductive adhesive film to the aforementioned range.

Also, the storage elastic modulus at 1 Hz of the electrically conductive adhesive film after sintering is preferably from 1000 to 30000 MPa, more preferably from 5000 to 20000 MPa. Strong adhesive power can be exerted and excellent properties in terms of thermal fatigue resistance evaluated by the thermal cycle test (TCT) can be exerted at the same time by limiting the elastic modulus of the electrically conductive adhesive film to the aforementioned range.

Also, the electrically conductive adhesive film preferably has a thermal weight loss of less than 1% when heated for 2 hours at 250° C. under a nitrogen atmosphere. By limiting the thermal weight loss to the aforementioned range, resin, in large part, would not thermally decompose when the electrically conductive adhesive film is sintered, and reliability can be secured by the excellent low bleed-out property.

When the electrically conductive adhesive film is analyzed by DSC (differential scanning calorimetry), it is preferable that at least one endothermic peak is observed in the temperature range of from 100 to 250° C. in a state before sintering (unsintered state), and that the endothermic peak disappears in a state after sintering (sintered state).

At least one endothermic peak observed in the aforementioned temperature range in an unsintered state indicates the melting point of the metal or alloy comprising at least one metal component. In other words, said endothermic peak indicates that when an unsintered electrically conductive adhesive film is heated (sintered) within the aforementioned temperature range, a specific metal component melts and wets over the surface of the object to which the electrically conductive adhesive film is adhered, which is advantageous for low-temperature mounting. In contrast, no endothermic peak is observed within the aforementioned temperature range in a sintered state, and this means that the melting point of the metal component (or alloy) of the metal or alloy comprising at least one metal component does not exist within the aforementioned temperature range. In other words, this means that a metal which has once melted forms after sintering an intermetallic compound having a high melting point by an intermetallic diffusion reaction, and that excellent heat resistance is obtained as a result.

This type of electrically conductive adhesive film enables sintering (mounting) at low temperatures, and, at the same time, exhibits excellent heat resistance after sintering (after mounting) and does not cause any defects even when carrying out wire bonding by using a high-melting-point lead-free solder or reflow treatment. The heat resistance temperature of the electrically conductive adhesive film is preferably 250° C. or higher, more preferably 300° C. or higher. Also, the mounting temperature suitable for mounting a semiconductor chip or the like with the use of the electrically conductive adhesive film is preferably from 100 to 250° C., more preferably from 100 to 200° C.

DSC 7000X, a product of Hitachi High-Tech Science Corp. and the like, for example, can be mentioned as a DSC measurement apparatus. The measurement conditions are as follows: measurement temperature range: room temperature to 350° C., temperature increase rate: 5° C./min., nitrogen flow rate: 20 mL/min., and the measurement is performed with the use of an aluminum sample pan.

Also, the electrically conductive adhesive film of the present embodiments preferably has a loss tangent (tan δ) defined by the ratio (G"/G') of a loss elastic modulus (G") to a storage elastic modulus (G') measured at 60° C. and 1 Hz in a B-stage state of 1.4 or higher. A higher tan δ under the aforementioned conditions indicates that the electrically conductive adhesive film excels in flexibility. The measurement and calculation methods of the loss elastic modulus (G"), storage elastic modulus (G') and tan δ will be explained later in the section concerning examples. Here, a B-stage state means a state in which 80% or more of the pre-curing calorific value, measured by DSC, derived from the thermosetting resin component is maintained.

Furthermore, by adhering the electrically conductive adhesive film of the present embodiments to a dicing tape to obtain a dicing-die bonding film, an electrically conductive adhesive film and a dicing tape can be simultaneously adhered to a wafer, and the processing steps can be simplified thereby.

The aforementioned embodiments will be explained by reference to the figures.

FIG. 2 is a cross-sectional diagram showing a dicing-die bonding film 10 an embodiment of the present disclosure. The dicing-die bonding film 10 mainly is composed of a dicing tape 12 and an electrically conductive adhesive film 13. The dicing-die bonding film 10 is one example of a tape for semiconductor processing, and the film may be cut in advance (pre-cut) into prescribed shapes in accordance with the used step or apparatus, may be cut for each semiconductor wafer, or may be have the form of a long roll.

The dicing tape 12 is composed of a supporting substrate 12a and an pressure-sensitive adhesive layer 12b formed thereon.

A release-treated PET film 11 covers the dicing tape 12 and protects the pressure-sensitive adhesive layer 12b and the electrically conductive adhesive film 13.

The supporting substrate 12a is preferably radiolucent. Specifically, plastic, rubber, and the like are normally used, but the material is not particularly limited as long as it is radiolucent.

The base resin composition of the pressure-sensitive adhesive of the pressure-sensitive adhesive layer 12b is not particularly limited, and an ordinary radiation-curable pressure-sensitive adhesive is used. An acrylic pressure-sensitive adhesive including a functional group, such as a hydroxyl group, reactive with an isocyanate group is preferable. Although there is no particular limitation, an acrylic pressure-sensitive adhesive having an iodine number of 30 or less and a radiation-curable carbon-carbon double bond structure is preferable.

As mentioned above, the electrically conductive adhesive film 13 of the present embodiments particularly preferably has a structure comprising a prescribed metal particle (P) and a prescribed resin (M) in terms of attaining excellent electrical conductivity, heat resistance and mounting reliability at the time of bonding a semiconductor power element to a metal lead frame, and of low environmental load.

(Method for Using Dicing-Die Bonding Film)

The dicing-die bonding film 10 of the present embodiments can be suitably used in the production of a semiconductor device.

First, the release-treated PET film 11 is removed from the dicing-die bonding film 10, the electrically conductive adhesive film 13 is adhered to a semiconductor wafer 1, and the side part of the dicing tape 12 is fixed with a ring frame 20 as shown in FIG. 3. The ring frame 20 is an example of dicing frames. The electrically conductive adhesive film 13 is laminated onto a part of the dicing tape 12 to which the semiconductor wafer 1 is bonded. There is no electrically conductive adhesive film 13 on the part of the dicing tape 12 that is in contact with the ring frame 20.

Thereafter, as shown in FIG. 4, the under surface of the dicing tape 12 is fixed by suction on the suction stage 22, and the semiconductor wafer 1 is diced into prescribed sizes by using a dicing blade 21 so as to produce a plurality of semiconductor chips 2.

Then, as shown in FIG. 5, while the dicing tape 12 is fixed by the ring frame 20, the tape push-up ring 30 is moved upwards to bend the center part of the dicing tape 12 upwards, and the dicing tape 12 is irradiated with radiation such as ultraviolet ray so as to weaken the adhesive power of the adhesive layer 12b that constitutes the dicing tape 12. Subsequently, the push-up pin 31 is moved upwards at positions corresponding to each semiconductor chip, and the semiconductor chips 2 are picked up by the suction collet 32.

Thereafter, as shown in FIG. 6, the picked up semiconductor chip 2 is adhered to a support component such as a lead frame 4 or to another semiconductor chip 2 (die-bonding step), and the electrically conductive adhesive film is sintered.

Then, as shown in FIG. 7, a semiconductor device is obtained through steps such as Al wire attachment and resin molding.

Embodiments of the present disclosure have been explained above, but the present disclosure is not limited to the aforementioned embodiments and includes various embodiments encompassed by the concept of the present disclosure and the claims. Also, various modifications may be made within the scope of the present disclosure.

EXAMPLES

The present disclosure will be further explained in detail below based on examples. However, the present disclosure is not limited by the examples.

<Raw Materials>

Abbreviations for the raw materials used are indicated as follows.

[Metal Particle (P)]

<First Metal Particle (P1)>

Dendritic copper powder: ECY, a product of Mitsui Mining & Smelting Co., Ltd., average particle size (D50): 6 μm, fractal dimension when viewed in a projection drawing in a primary particle state: 1.23

Silver-coated dendritic copper powder: Kontaktargen 20, a product of GGP Metalpowder AG, average particle size (D50): 8 μm, fractal dimension when viewed in a projection drawing in a primary particle state: 1.41

<Second Metal Particle (P2)>

Silver-coated spherical copper powder: TFM-C05P, a product of Toyo Aluminum K.K., average particle size (D50): 6 μm, fractal dimension when viewed in a projection drawing in a primary particle state: 1.03

Spherical tin powder: ST-3, a product of Mitsui Mining & Smelting Co., Ltd., average particle size (D50): 7 μm, fractal dimension when viewed in a projection drawing in a primary particle state: 1.04

Spherical copper powder: MA-C05K, a product of Mitsui Mining & Smelting Co., Ltd., average particle size (D50): 5 μm, fractal dimension when viewed in a projection drawing in a primary particle state: 1.04

The average particle size (D50) of the metal particles was measured by a laser diffractometer (SALD-3100, product of Shimadzu Corp.).

Also, the fractal dimension when viewed in a projection drawing in a primary particle state was calculated by the box counting method under the following conditions.

First, an SEM image of each metal powder was recorded (measuring apparatus: TM3030 Plus, product of Hitachi High-Tech Science Corp., magnification: 1000 to 5000 folds), and five primary particle was randomly selected.

Next, the recorded SEM image of one of the primary particles was binarized by using an image processing software (Image-J) as with the particle shown in FIG. 1, and the profile line of the primary particle was further extracted from the processed image. Then, by using a box counting tool of the image processing software, the side length d of the square boxes was stepwise varied from 2 to 36 pixels, and the number N(d) of covering boxes was counted for each d. The obtained side length d of each square box and the corresponding number N(d) of covering boxes were plotted in a common logarithmic scale in accordance with the aforementioned equation (II), and the fractal dimension was calculated from the slope of the straight line.

The same process was carried out with respect to the remaining four primary particles, and the fractal dimensions calculated for the randomly selected five particles were averaged to obtain the value of the fractal dimension of each metal powder when viewed in a projection drawing in a primary particle state.

[Thermosetting Resin (M1)]

Epoxy resin 1

Mixture obtained by mixing YD-128, YD-013, YP-50 and 2PHZ in a mass ratio of 15:5:10:1

YD-128: Bisphenol A-type liquid epoxy resin, a product of Nippon Steel & Sumikin Chemical Co., Ltd.

YD-013: Bisphenol A-type solid epoxy resin, a product of Nippon Steel & Sumikin Chemical Co., Ltd. (The same applies hereinafter.)

YP-50: Phenoxy resin, a product of Nippon Steel & Sumikin Chemical Co., Ltd. (The same applies hereinafter.)

2PHZ: 2-phenyl-4,5-dihydroxymethylimidazole, a product of Shikoku Chemicals Corp. (The same applies hereinafter.)

Epoxy resin 2

Mixture obtained by mixing EP4000L, YD-013, YP-50 and 2PHZ in a mass ratio of 20:5:5:1

EP4000L: Propylene glycol-modified epoxy resin, a product of ADEKA Corp.

Maleimide resin 1

Mixture obtained by mixing 1,6'-bismaleimide-(2,2,4-trimethyl)hexane with, as a polymerization initiator, Perbutyl® O in a mass ratio of 100:5

1,6'-bismaleimide-(2,2,4-trimethyl)hexane: experimentally synthesized product; the backbone derived from an aliphatic amine has a carbon atom number of 9.

Perbutyl® O: t-butyl peroxy-2-ethylhexanoate, a product of Nihon Yushi Corp. (The same applies hereinafter.)

Maleimide resin 2

Mixture obtained by mixing 1,10-bismaleimide-n-decane with, as a polymerization initiator, Perbutyl® O in a mass ratio of 100:5

1,10-bismaleimide-n-decane: experimentally synthesized product; the backbone derived from an aliphatic amine has a carbon atom number of 10

Maleimide resin 3

Mixture obtained by mixing BMI-3000 with, as a polymerization initiator, Perbutyl® O in a mass ratio of 100:5

BMI-3000: Bismaleimide resin represented by the following structural formula (6), a product of DESIGNER MOLECULES INC, number-average molecular weight: 3000. In the formula (6), n is an integer from 1 to 10. The backbone derived from an aliphatic amine has a carbon atom number of 36.

Abietic acid: a product of Tokyo Chemical Industry Co., Ltd.

[Dicing Tape]

A dicing tape was obtained by applying an adhesive composition onto a supporting substrate so that the thickness of the pressure-sensitive adhesive composition after drying would be 5 μm, and then drying the same for 3 minutes at 120° C.

Pressure-sensitive adhesive composition: A mixture obtained by mixing n-octylacrylate (product of Osaka Organic Chemical Industry Ltd.), 2-hydroxyethylacrylate (product of Osaka Organic Chemical Industry Ltd.), methacrylic acid (product of Tokyo Chemical Industry Ltd.), and, as a polymerization initiator, benzoyl peroxide (product of Tokyo Chemical Industry Co., Ltd.) in a mass ratio of 200:10:5:2 was dispersed in an appropriate amount of toluene, and an acrylic resin solution including a functional group was obtained by adjusting the reaction temperature and time. Then, 2 parts by mass of CORONATE L (product of Tosoh Corp.) was added as a polyisocyanate relative to 100 parts by weight of the acrylic resin solution, an appropriate amount of toluene was further added as an additional solvent, and the mixture was agitated to obtain a pressure-sensitive adhesive composition.

Supporting substrate: A supporting substrate was obtained by melting resin beads made of low-density polyethylene (NOVATEC LL, product of Japan Polyethylene Corp.) at 140° C., and forming the same into a long film with a thickness of 100 μm with the use of an extruder.

(6)

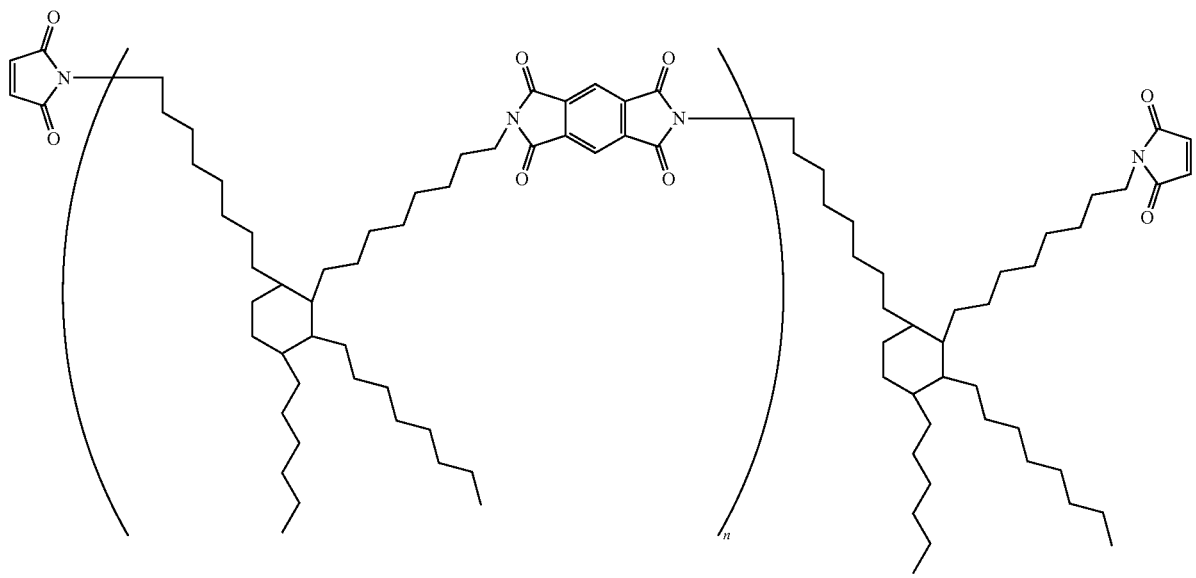

Phenol novolac resin

H-4: a product of Meiwa Plastic Industries, Ltd.

[Flux]

Hydroxylamine Salt

Mixture obtained by mixing N,N,N',N'-tetrakis(2-hydroxyethyl)ethane-1,2-diamine (product of Tokyo Chemical Industry Co., Ltd.) with oleic acid (product of Tokyo Chemical Industry Co., Ltd.) in a mass ratio of 2:3

Tetraethylene glycol: a product of Tokyo Chemical Industry Co., Ltd.

<Production of Electrically Conductive Adhesive Film>

Example 1

In Example 1, the materials shown in Table 1, among the aforementioned materials, were mixed so as to prepare a mixture of 85% by mass of the metal particle (P), 10.5% by mass of the resin (M), and 4.5% by mass of the flux, then toluene was added thereto as a solvent to obtain a slurry, and the slurry was thinly applied onto a mold release-treated PET film after agitation using a planetary mixer, then dried for 2 minutes at 120° C. to obtain an electrically conductiveadhesive film with a thickness of 40 µm. The metal particle (P) used here consisted solely of a dendritic copper powder used as the first metal particle (P1).

Example 2

In Example 2, an electrically conductive adhesive film was obtained in the same manner as in Example 1 except that the materials shown in Table 1, among the aforementioned materials, were mixed so as to prepare a mixture of 88% by mass of the metal particle (P), 7.5% by mass of the resin (M), and 4.5% by mass of the flux.

Examples 3 to 5

In Examples 3 to 5, electrically conductive adhesive films were obtained in the same manner as in Example 1 except that the materials shown in Table 1, among the aforementioned materials, were mixed so as to prepare mixtures of 88% by mass of the metal particle (P) and 12% by mass of the resin (M).

Example 6

In Example 6, an electrically conductive adhesive film was obtained in the same manner as in Example 3 except that maleimide resin 3 was used as the resin (M), and that metal particle (P) was prepared so that the proportion of the silver-coated dendritic copper powder as the first metal particle (P1) would be 20% by mass, and that, as the second metal particle (P2), the proportion of the silver-coated spherical copper powder would be 40% by mass and the proportion of the spherical tin powder would be 40% by mass in 100% by mass of the metal particle (P).

Example 7

In Example 7, an electrically conductive adhesive film was obtained in the same manner as in Example 6 except that the resin (M) was prepared so that the proportion of the maleimide resin 3 would be 95% by mass and the proportion of the phenol novolac resin would be 5% by mass in 100% by mass of the resin (M).

Comparative Examples 1 and 2

In Comparative Examples 1 and 2, electrically conductive adhesive films were obtained in the same manner as in Example 1 except that the materials shown in Table 1, among the aforementioned materials, were mixed so as to prepare mixtures of 85% by mass of the metal particle (P), 8% by mass of the resin (M), and 7% by mass of the flux.

<Production of Dicing-Die Bonding Film>

The thus obtained electrically conductive adhesive films of the examples and comparative examples were adhered to a dicing tape to obtain dicing-die bonding films (electrically conductive adhesive film/pressure-sensitive adhesive composition/supporting substrate).

<Evaluation>

The properties below were evaluated with respect to the thus obtained electrically conductive adhesive films and dicing-die bonding films of the examples and comparative examples. The evaluation conditions for each property are as described below. The results are shown in Table 1.

[Volume Resistivity (Electrical Conductivity)]

The electrically conductive adhesive films of the examples and comparative examples were placed on a Teflon® sheet and sintered for 3 hours at 230° C. so as to obtain measurement samples. Then, resistivity of the measurement samples was measured by the four probe method in accordance with JIS-K7194-1994 so as to calculate the volume resistivity. Loresta-GX, a product of Mitsubishi Chemical Analytech Co., Ltd., was used for measuring the resistivity. The reciprocal of the volume resistivity is the electrical conductivity, and a lower volume resistivity indicates excellent electrical conductivity. A volume resistivity of 1000 µΩ·cm or less was determined to be the acceptance line in the present examples.

[Tan δ (flexibility)]

The electrically conductive adhesive films of the examples and comparative examples semi-cured to the B-stage state by the aforementioned drying step for 2 minutes at 120° C. were laminated by thermocompression bonding into a thickness of 1 mm so as to obtain measurement samples with a plate diameter of 8 mmφ. Then, the loss tangent (tan δ) at 60° C. of these measurement samples was measured under shear conditions of a frequency of 1 Hz and a strain amount of 0.3% with the use of a dynamic viscoelastometer ARES (product of Rheologica).

[Presence or Absence of PKG Delamination (Moisture Absorption Resistance)]

The dicing-die bonding films of the examples and comparative examples were bonded to the surfaces of Si wafers with an Au-plated backside at 100° C., then the wafers were diced into 5 mm squares to obtain diced chips (Au plating/Si wafer/electrically conductive adhesive film). Each chip was die-bonded onto an Ag-plated metal lead frame at 140° C., subsequently sintered for 3 hours at 230° C., and then sealed with an epoxy-based molding resin (KE-G300, product of Kyocera Chemical Corp.) so as to cover the chip to obtain measurement samples.

The obtained measurement samples were subjected to MSL-Lv1 and 2 of the reflow test after moisture absorption in conformity with JEDEC J-STD-020D1 (based on lead-free solder) under the conditions below. Then, whether or not inner delamination occurred was observed with the use of an ultrasonic imaging apparatus (Fine SAT, product of Hitachi Power Solutions Co., Ltd.). No PKG delamination after MSL-Lv2, at the least, was determined to be acceptable in the present examples.

(Moisture Absorption Conditions)
  MSL-Lv1: 168 hours at 85° C., 85% RH
  MSL-Lv2: 168 hours at 85° C., 60% RH
(Reflow Classification Temperature)
  260° C. in both of MSL-Lv1 and 2

[Shear Adhesion (Adhesion/Heat Resistance)]

The dicing-die bonding films of the examples and comparative examples were bonded to the surfaces of Si wafers with an Au-plated backside at 100° C., then the wafers were diced into 5 mm squares to obtain diced chips (Au plating/Si wafer/electrically conductive adhesive film). Each chip was die-bonded onto an Ag-plated metal lead frame at 140° C., then sintered for 3 hours at 230° C. so as to obtain measurement samples.

Shear adhesion of the electrically conductive adhesive films before and after the thermal cycle test (hereinafter "TCT") was measured with respect to the obtained measurement samples.

(Adhesive Power Before TCT)

A die shear tester (multi-purpose bond tester series 4000, product of Nordson Advanced Technology) was used, and the scratch tool of the bond tester was hit against the side of the semiconductor chip of the obtained measurement samples at 100 μm/s, and the stress when the chip/lead frame bond was broken was measured as the shear adhesion at 260° C. A shear adhesion before TCT of 3 MPa or more was determined to be the acceptable level in the present examples.

(Adhesive Power after TCT)

Next, a thermal cycle test (TCT) was performed on the obtained measurement samples by subjecting the samples to 200 cycles of a treatment in a temperature range of from −40 to +150° C. The shear adhesion of the treated samples was measured in the same manner as in the aforementioned test concerning the adhesive power before TCT. A shear adhesion after TCT of 1 MPa or more was determined to be the acceptable level in the present examples.

In contrast, particularly because the metal particle (P) of Comparative Examples 1 and 2 did not comprise first particle (P1) having a fractal dimension of 1.1 or more when viewed in a projection drawing in a primary particle state, the electrically conductive adhesive films of Comparative Examples 1 and 2 had inferior electrical conductivity, heat resistance and mounting reliability compared with the inventive Examples 1 to 7. Specifically, in Comparative Examples 1 and 2, the volume resistivity was notably high, and PKG delamination occurred even after MSL-Lv2 in the moisture absorption resistance test, which confirmed poor moisture absorption resistance. Also, regarding the adhesive power, the shear adhesion, which was not so high even before TCT, was 0 after TCT, which confirmed that the electrically conductive adhesive films of the comparative examples also had poor thermal impact resistance.

TABLE 1

| | | | Example 1 | Example 2 | Example 3 | Example 4 | Example 5 |
|---|---|---|---|---|---|---|---|
| Constituent components of adhesive film | Metal particle (P) | First metal particle (P1) | Dendritic copper powder | Dendritic copper powder | Silver-coated dendritic copper powder | Silver-coated dendritic copper powder | Silver-coated dendritic copper powder |
| | | Second metal particle (P2) | — | — | — | — | — |
| | Resin (M) | | Epoxy resin 1 | Epoxy resin 2 | Epoxy resin 2 | Maleimide resin 1 | Maleimide resin 2 |
| | Flux | | Hydroxylamine salt | Hydroxylamine salt | — | — | — |
| Evaluation results | Volume resistivity [μΩ · cm] | | 600 | 600 | 100 | 180 | 200 |
| | tan δ | | 1.1 | 1.8 | 1.6 | 1.2 | 1.9 |
| | PKG delamination | After MSL-Lv.2 | No delamination | No delamination | No delamination | No delamination | No delamination |
| | | After MSL-Lv.1 | Delamination | Delamination | No delamination | No delamination | No delamination |
| | Shear adhesion [MPa] | Before TCT | 3 | 9 | 7 | 5 | 14 |
| | | After TCT | 1 | 9 | 6 | 2 | 12 |

| | | | Example 6 | | Example 7 | | Comparative Example 1 | Comparative Example 2 |
|---|---|---|---|---|---|---|---|---|
| Constituent components of adhesive film | Metal particle (P) | First metal particle (P1) | Silver-coated dendritic copper powder | 20% | Silver-coated dendritic copper powder | 20% | — | — |
| | | Second metal particle (P2) | Silver-coated spherical copper powder | 40% | Silver-coated spherical copper powder | 40% | Spherical copper powder | Spherical copper powder |
| | | | Spherical tin powder | 40% | Spherical tin powder | 40% | | |
| | Resin (M) | | Maleimide resin 3 | | Maleimide resin 3 Phenol novolac resin | 95% 5% | Epoxy resin 1 | Epoxy resin 1 |
| | Flux | | — | | — | | Tetraethylene glycol | Abietic acid |
| Evaluation results | Volume resistivity [μΩ · cm] | | 50 | | 60 | | 9000 | 14000 |
| | tan δ | | 2.2 | | 2.5 | | 1.3 | 0.8 |
| | PKG delamination | After MSL-Lv.2 | No delamination | | No delamination | | Delamination | Delamination |
| | | After MSL-Lv.1 | No delamination | | No delamination | | Delamination | Delamination |
| | Shear adhesion [MPa] | Before TCT | 20 | | 30 | | 1 | 2 |
| | | After TCT | 24 | | 36 | | 0 | 0 |

*In the table, the results in bold and underlined indicate those outside the appropriate range of the present invention and those that did not reach the acceptable level in the examples. Also, "%" means "% by mass".

From the results above, it was confirmed that the electrically conductive adhesive films of Examples 1 to 7 exhibit notable effects that were not achieved by prior art, i.e., particularly excellent electrical conductivity and both heat resistance and mounting reliability after bonding and sintering, by comprising metal particle (P) and a resin (M), in which the resin (M) comprises a thermosetting resin (M1), and the metal particle (P) has an average particle size (d50) of 20 μm or less and comprise 10% by mass or more of first metal particle (P1) having a fractal dimension of 1.1 or more when viewed in a projection drawing in a primary particle state.

What is claimed is:

1. An electrically conductive adhesive film comprising:
   a metal particle (P); and
   a resin (M),
   wherein the resin (M) comprises a thermosetting resin (M1),
   the metal particle (P) has an average particle size (d50) of 20 μm or less, and
   the metal particle (P) comprises 10% by mass or more of a first metal particle (P1) having a fractal dimension of 1.1 or more when viewed in a projection drawing in a primary particle state, wherein a loss tangent (tan δ)

defined by a ratio of a loss elastic modulus to a storage elastic modulus at 60° C. and 1 Hz in a B-stage state is 1.4 or higher.

2. The electrically conductive adhesive film according to claim 1, wherein the first metal particle (P1) is a dendritic metal powder.

3. The electrically conductive adhesive film according to claim 2, wherein the first metal particle (P1) has a surface coated with a noble metal.

4. The electrically conductive adhesive film according to claim 1, wherein the metal particle (P) further comprises a second metal particle (P2) made of a spherical metal powder.

5. The electrically conductive adhesive film according to claim 4, wherein the second metal particle (P2) has an average particle size (d50) of less than 7 μm.

6. The electrically conductive adhesive film according to claim 4, wherein the second metal particle (P2) comprises a metal particle made of tin or a tin-containing alloy.

7. The electrically conductive adhesive film according to claim 1, wherein the thermosetting resin (M1) comprises a maleic acid imide compound including two or more units of an imide group in a single molecule.

8. The electrically conductive adhesive film according to claim 7, wherein the maleic acid imide compound comprises a backbone derived from an aliphatic amine having a carbon atom number of 10 or more.

9. The electrically conductive adhesive film according to claim 1, wherein the thermosetting resin (M1) comprises an epoxy resin.

10. The electrically conductive adhesive film according to claim 9, wherein the epoxy resin comprises a molecular backbone derived from a glycidyl ether of an aliphatic diol.

11. The electrically conductive adhesive film according to claim 7, wherein the thermosetting resin (M1) further comprises a phenol novolac resin.

12. The electrically conductive adhesive film according to claim 9, wherein the thermosetting resin (M1) further comprises an imidazole-based compound.

13. A dicing-die bonding film, comprising:
a dicing tape; and
the electrically conductive adhesive film according to claim 1 adhered to the dicing tape.

\* \* \* \* \*